United States Patent [19]

Komiya

[11] Patent Number: 5,122,856
[45] Date of Patent: Jun. 16, 1992

[54] SEMICONDUCTOR DEVICE

[75] Inventor: Yoshio Komiya, Yokohama, Japan

[73] Assignee: Nissan Motor Co., Ltd., Yokohama, Japan

[21] Appl. No.: 602,051

[22] Filed: Oct. 25, 1990

Related U.S. Application Data

[63] Continuation of Ser. No. 270,996, Nov. 14, 1988, abandoned.

[30] Foreign Application Priority Data

Nov. 13, 1987 [JP] Japan .................. 62-285473
Nov. 16, 1987 [JP] Japan .................. 62-287394

[51] Int. Cl.⁵ .............. H01L 29/06; H01L 29/02; H01L 29/48; H01L 29/44
[52] U.S. Cl. ........................ 357/55; 357/68; 357/44
[58] Field of Search ............ 357/65, 68, 23.4, 44

[56] References Cited

U.S. PATENT DOCUMENTS

| 4,505,799 | 3/1985 | Baxter ...................... 204/416 |
| 4,537,654 | 8/1985 | Berenz ...................... 437/22 |
| 4,601,096 | 7/1986 | Calviello ................... 29/571 |
| 4,733,283 | 3/1988 | Kuroda ...................... 357/22 |
| 4,835,589 | 5/1989 | Pfiester ..................... 357/51 |
| 4,893,174 | 1/1990 | Yamada et al. ............. 357/82 |

FOREIGN PATENT DOCUMENTS

| 0011215 | 5/1969 | Japan ....................... 357/55 |
| 0057792 | 5/1977 | Japan ....................... 357/55 |
| 0065666 | 5/1977 | Japan ....................... 357/55 |
| 2067354 | 7/1981 | United Kingdom ..... 357/55 |

OTHER PUBLICATIONS

Jay et al, 'Isolated Power Feed through Holes', IBM Tech, vol. 16 #11, pp. 3592-3593, Apr. 1974.
Magdo, 'Pyramid Shaped Electrical Feedthrough in Silicon Wafers', IBM Tech. Discl. Bul, vol. 19, No. 4, Sep. 76.
Wu, 'Wafer Structure Permitting Distribution from the Backside of the Wafer', IBM Tech Discl Bul, vol. 16, No. 9, Feb. 74.
Yasumoto et al. "Promising New Fab. ...", JEDM84, (1984) pp. 816-819.
Wrathall, "The Design of a High Power Solid State Automotive Switch in CMOS-VDMOS Technology," IEEE, Power Electronics Specialists Conference Record, 1985 pp. 229-233.

Primary Examiner—Andrew J. James
Assistant Examiner—Stephen D. Meier
Attorney, Agent, or Firm—Foley & Lardner

[57] ABSTRACT

A semiconductor device having a semiconductor layer, in which an active device such as a MOS or bipolar transistor in the front surface area of the semiconductor layer, and a device for communicating the front and rear surfaces of the semiconductor layer is formed therein in connection with one of the electrodes of the active device and exposes to a groove formed in the rear surface of the semiconductor layer. A three-dimensional semiconductor device including at least two semiconductor devices stacked one on another is also disclosed.

55 Claims, 5 Drawing Sheets

SEMICONDUCTOR DEVICE

This application is a continuation of application Ser. No. 07/270,996, filed Nov. 14, 1988 now abandoned.

BACKGROUND OF THE INVENTION

1. Filed of the Invention

The present invention relates to a semiconductor device such as an active semiconductor device having at least three terminals, a semiconductor device of an integrated circuit form and a three-dimensional semiconductor device, including a communicating device for readily and exactly performing a signal communication between front and rear surfaces of a semiconductor substrate therethrough.

2. Description of the Background Art

In a semiconductor substrate including conventional semiconductor devices or an integrated circuit (IC) having the same, there is usually provided with one terminal for a drain or the like of one of devices on the rear surface and are, in turn, provided with other terminals for the devices on the front main surface in the form of metallic contact terminals or electrodes at an insulating oxide film.

For instance, IEEE Power Electronics Specialists Conference Record, 1985, pp 229-233, discloses a cross section of a power MOSFET having a protector function therein. In this case, various elements or devices are formed in the front main surface of the semiconductor substrate, and almost all of their electrode terminals are formed on the front main surface, while only one output drain terminal is formed on the rear surface.

In such a conventional case, the rear surface of the semiconductor substrate is contacted with a mounting substrate, and it is enough to provide only one voltage source to the semiconductor substrate. Further, even when the front main surface including the semiconductor IC is bonded to the mounting substrate facing thereto, it is unnecessary to provide a plurality of electrodes independently for applying different voltages on the rear surface of the semiconductor substrate having a certain thickness. Hence, it is not considered to supply a plurality of different voltages or currents from the rear surface to the front main surface of the semiconductor substrate therethrough while being isolated from one another.

In a conventional three-dimensional laminated semiconductor substrate structure, as disclosed in Nikkei Micro Device, 1985, July, pp 175-192, the signal communication between the front and rear surfaces of the semiconductor substrate on which various devices or ICs are formed on the front surface, is developed insufficiently. Accordingly, when two laminated semiconductor substrates are further laminated one on another, the desired electrode portions of the two substrates are positioned and are securely connected in order to carry out the signal communication between the two substrates. However, in this case, it is rather difficult to provide wirings for connecting the front and rear surfaces of the substrates.

Another conventional three-dimensional laminated semiconductor substrate structure is prepared by stacking a plurality of semiconductor substrates, as disclosed in IEEE Computer, 1984, January, p 69, by Jan. Grinberg. In this embodiment, an ohmic wiring penetrating the substrate is produced by forming a $p^+$-type region passing through an n-type semiconductor substrate using a p-type aluminum dopant diffusion based on the heat transfer diffusion by the aluminum dot. The interconnection between the two substrates is realized by contacting cross-linked two metallic microbridges for connection.

In this case, however, since the feed through portion is composed of the $p^+$-type portion of the P-N junction and a separation of P-N junction is used, it is difficult to control a distribution capacity due to the PN junction and upper and lower resistance values of the $p^+$-type portion. Further, since the microbridges are not securely connected to each other, it is insufficient in stability of the mechanical structure for linking the two substrates, and its sufficient or ideal isolation from the other portions can not be performed.

SUMMARY OF THE INVENTION

Accordingly, it is an object of the present invention to provide a semiconductor device including a communicating device, free from the aforementioned defects and disadvantages of the prior art, which is capable of readily and exactly performing a signal communication or an ohmic connection between front and rear surfaces of a semiconductor substrate, and realizing a perfect isolation of the coupling device from other portions.

In accordance with one aspect of the present invention, there is provided a semiconductor device comprising a semiconductor layer, an active device having at least two electrodes, formed in a front surface area of the semiconductor device, a groove formed in a rear surface portion of the semiconductor layer, and means for communicating the front and rear surfaces of the semiconductor layer, the communicating means being formed in the semiconductor layer in connection with one of the electrodes of the active device, and exposing to the groove.

In accordance with another aspect of the invention, there is provided a three-dimensional semiconductor device, comprising first and second semiconductor devices stacked one on another, the first semiconductor device including a first semiconductor layer, a first active device having at least two electrodes, formed in a front surface area of the semiconductor layer, a groove formed in a rear surface portion of the semiconductor layer, and means for communicating the front and rear surfaces of the semiconductor layer, the communicating means being formed in the semiconductor layer in connection with one of the electrodes of the active device, and exposing to the groove, the second semiconductor device including a second semiconductor layer, and a second active device having at least two electrode, formed in the second semiconductor layer, one of the electrodes of the second active device being connected to the communicating means of the first semiconductor device.

DESCRIPTION OF THE PREFERRED EMBODIMENTS

Figure 1:
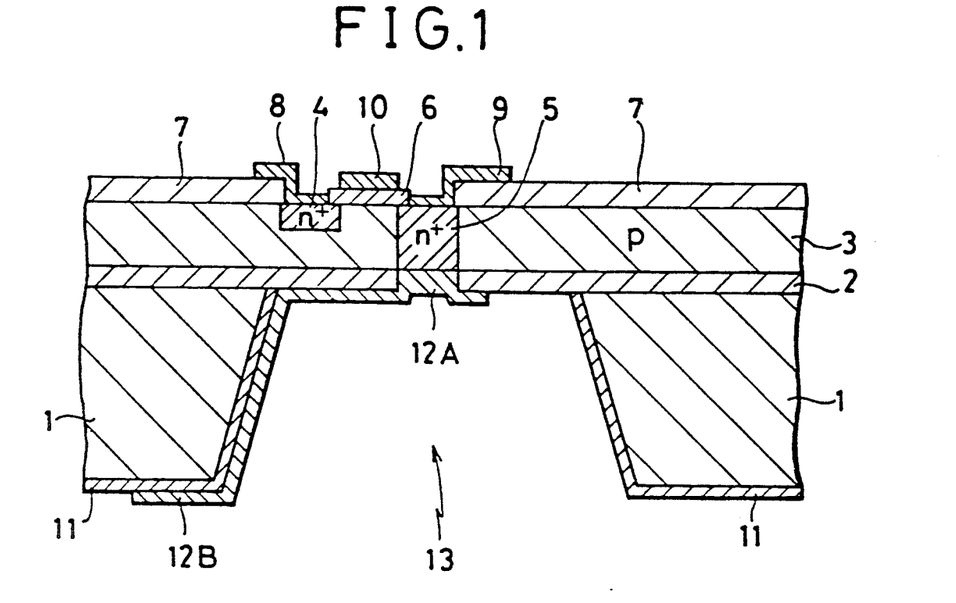
FIG. 1 is a cross sectional view of a first embodiment of a semiconductor device including a MOS transistor according to the present invention.

Referring now to the drawings, wherein like reference characters designate like or corresponding parts throughout the views, there is shown in FIG. 1 the first embodiment of a semiconductor device such as a MOS device of a silicon-on-insulator (SOI) structure according to the present invention.

In FIG. 1, a silicon oxide ($SiO_2$) film 2 is formed on the upper or front surface of a silicon (Si) semiconductor substrate 1, and a bottom groove 13 is formed on the lower or rear surface of the substrate 1 to reach the silicon oxide film 2 in a conventional manner, e.g., some etching processes similar to those employed in a silicon pressure sensor production. A p-type semiconductor crystalline layer 3 is formed on the silicon oxide film 2 using a conventional SOI technique. An $n^+$-type source 4 is formed in the surface area of the silicon crystalline layer 3, and a $n^+$-type drain 5 is formed in the active silicon layer of the SOI type to penetrate deeply the silicon crystalline layer 3 and the silicon oxide film 2 and to reach the bottom (seen from the rear surface, i.e., the upper end in FIG. 1) of the groove 13 on the rear surface of the substrate 1.

An insulating gate film 6 is formed on the front surface of the silicon crystalline layer 3 to bridge between the source 4 and the drain 5, and a field oxide film 7 is also formed on the surface of the layer 3. A source electrode 8, a drain electrode 9 and a gate electrode 10 are attached to the surfaces of the source 4, the drain 5 and the gate film 6, respectively, in a conventional manner. An insulating oxide film 11 is also formed on the rear surface of the substrate 1 in a conventional manner to cover the rear surface thereof.

In this embodiment, when the thickness of the silicon substrate 1 is designed to approximately 300μ to 500μ, its thickness of the remaining upper portion (not shown) which defines the bottom of the groove 13 may be designed to approximately 10μ to 30μ.

A particular patterning method is required in order to form a rear contact portion 12A and a rear surface wiring portion 12B integrally connected thereto. That is, since the contact portion 12A and the rear surface wiring portion 12B are apart from each other with a somewhat long distance with respect to the rear end surface, a usual photo-lithography process can not be applied for the patterning. The patterning can be carried out in a lithography step by exposing with the light beam of an ultraviolet to far ultraviolet ray range using a mask to be placed in close proximity to the substrate 1 and an optical system including a laser light source with a well parallelism. A direct pattern etching, now being developed, where a photo-chemical reaction is directly conducted in a excited etching gas atmosphere using a pattern mask and a laser beam, may be also applicable.

As described above, in the first embodiment shown in FIG. 1, the $n^+$-type region 5 penetrates the epitaxial layer 3 to the bottom groove 13 of the rear surface of the substrate 1 and is connected to the wiring portion 12B formed on the rear surface of the substrate 1 through the contact portion 12A, and the wiring portion 12B is isolated from the substrate 1 by the insulating oxide film 11 covering the side and rear surfaces of the substrate 1 and the silicon oxide film 2 covering the front surface of the substrate 1. Therefore, the $n^+$-type drain 5 can be provided with one connection terminal as the drain terminal 9 on the front surface of the substrate 1 and another independent connection terminal as the rear wiring portion 12B on the rear surface of the substrate 1 separate from the other portions. The rear terminals 12A and 12B are connected to a voltage source separate from the voltage of the substrate bulk.

In the embodiment of FIG. 1, although only the drain 5 is connected to the two terminals on the front and rear surfaces of the substrate 1, other active regions such as the source 4 or the like of the MOS transistor may be, of course, connected to the two terminals on the front and rear surfaces of the substrate 1. That is, one of the electrodes of the active device such as the MOS transitor can be communicated to the front and rear surfaces of the substrate. Further, an anode or cathode of a diode formed in the surface area of the substrate may be contacted to the two terminals on the front and rear surfaces of the substrate.

In the SOI device shown in FIG. 1, an ohmic connection with the $n^+$-type drain 5 of the MOS transistor can be performed using the contact portion 12A on the rear surface of the substrate 1. Thus, when the signal processing is conducted by the N-channel EDMOS formed in the silicon crystalline layer 3 formed on the silicon oxide film 2, the signal can be transmitted from the drain 5 to another member such as an inverter or the like positioned in the same plane as the drain 5 through the drain electrode 9 and to other members on the front surface of another substrate positioned under the substrate 1 including the drain 5 via the contact portion 12A and the rear wiring portion 12B in a multi-layer lamination three-dimensional semiconductor device composed of at least two semiconductor substrates stacked one on another.

In the first embodiment described above, it is readily understood that the following effects and advantages can be obtained.

Since the electrode such as the drain is connected to the two terminals on the front and rear surfaces of the substrate, a separation of an output current is advantageously performed in a power device where a large current flows in the direction perpendicular to the substrate, and a plurality of terminals for one drain can be advantageously provided on the front and rear surfaces in the MOS transistor.

Since in addition to the front surface including various devices or ICs, a plurality of wiring terminals for electrodes can be separately provided along side surfaces of a groove formed on the rear surface of the substrate, a communication of a plurality of signals between the front and rear surfaces of the substrate can be simultaneously carried out. Further, this parallel signal communication can be performed by the ohmic contact and can be controlled by control signals of an active device having three electrode terminals such as a MOS transistor, and thus a switching function and an amplifying action can be also possible in the same time.

When a plurality of semiconductor substrates including various devices and ICs on their front surfaces are laminated one on another and the desired electrode portions are aligned and are securely connected by heat melting to form a multi-layer lamination three-dimensional semiconductor device structure, a plurality of signals can be communicated in parallel among the front and rear surfaces from the top to bottom substrates. Thus, a parallel processing, a high functioning and a large capacity of an information processor such as a microcomputer and an image processor may be performed.

Further, the semiconductor device of the present invention can be applied to realize a laminated three-dimensional parallel processing intelligent sensor including a first layer having a plurality of sensor devices, and second and third layers having operational devices, memories and the like.

By using a laminated three-dimensional semiconductor device prepared by stacking a plurality of devices of the present invention, the defects and disadvantages arise in a conventional IC highly integrated in a flat plane can be removed or largely improved. That is, a tip size can be minimized, and a wiring length within the tip can be largely reduced to improve the transmission speed of the signal through the tip. Further, a layout limitation of cells and wiring can be reduced, and an inferior rate of manufactured tips can be considerably reduced.

Figure 2:
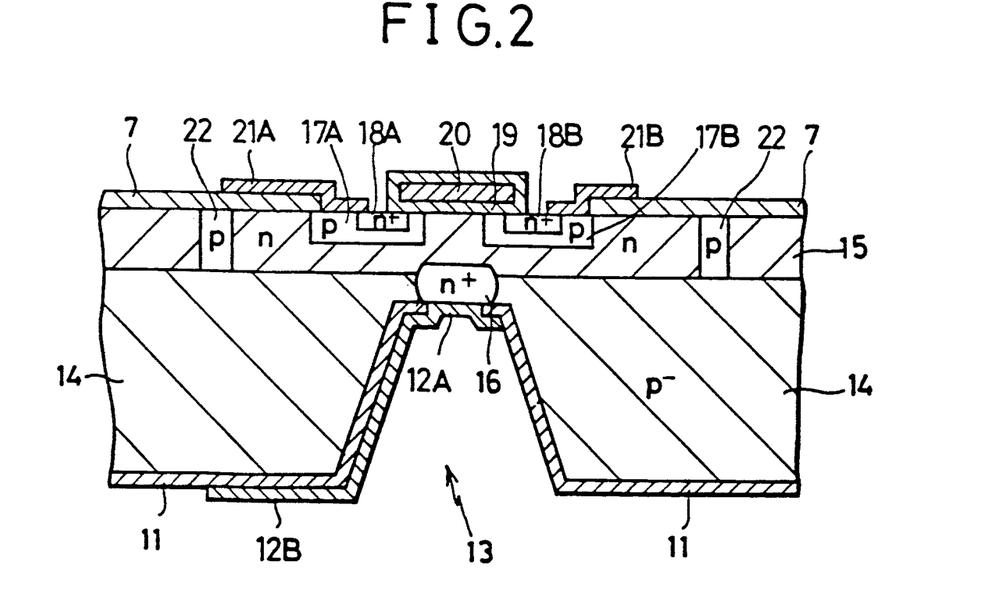
FIG. 2 is a cross sectional view of a second embodiment of a semiconductor device including a vertical DSAMOS transistor according to the present invention.

In FIG. 2, there is shown the second embodiment of a semiconductor device including a vertical DSAMOS transistor according to the present invention, having basically the same construction as that of the first embodiment shown in FIG. 1.

In FIG. 2, an n-type epitaxial layer 15 is grown on a p⁻-type semiconductor substrate 14, and an n⁺-type buried drain layer 16 is formed in the substrate 14 between the lower end portion of the epitaxial layer 14 and a groove 13 formed in the rear surface of the substrate 14 to penetrate the substrate 14 and to reach the bottom (the upper end in FIG. 2) of the groove 13. The substrate 14 functions for electrically separating the n⁺-type buried drain layer 16. A field oxide film 7 covers the surface of the epitaxial layer 14 in the same manner as the first embodiment.

A pair of p-type base regions 17A and 17B are formed in the surface portion of the epitaxial layer 15 at a certain distance away from each other, and a pair of n⁺-type source regions 18A and 18B are formed in the surface portions of the respective base regions 17A and 17B. An insulating gate film 19 is formed on the surface of the epitaxial layer 15 between the parts of the two source regions 18A and 18B formed in the drain regions 17A and 17B, and a highly impurity-doped silicon poly-crystalline gate electrode 20 is formed in the insulating gate film 19. A pair of source-base common electrodes 21A and 21B are attached to the surfaces of the parts of the sources 18A and 18B and drains 17A and 17B. These parts described above can be formed in a conventional manner.

In this embodiment, the buried layer 16 of the vertical DSAMOS transistor formed in the front main surface area exposes to the bottom of the groove 13, and the bottom of the buried layer 16 is contacted with a rear contact portion 12A which is integrally connected to a rear surface wiring portion 12B in the same manner as the first embodiment. A pair of p-type separation regions 22 may be formed in the epitaxial layer 15 in order to improve the separation of the drains from the other members.

In the second embodiment shown in FIG. 2, since the drain portions can be partially restricted, the drain electrode terminals can be separately provided on the rear surface of the substrate. Hence, a plurality of vertical MOS transistors having each drain electrode terminal on the rear surface can be produced in the same substrate. When the chip is so mounted that the wiring may be carried out from both front and rear surfaces of a substrate, a plurality of vertical MOS transistors can be arranged in the same substrate. Further, of course, the same effects and advantages as those of the first embodiment of the present invention can be obtained in the second embodiment.

Figure 3:
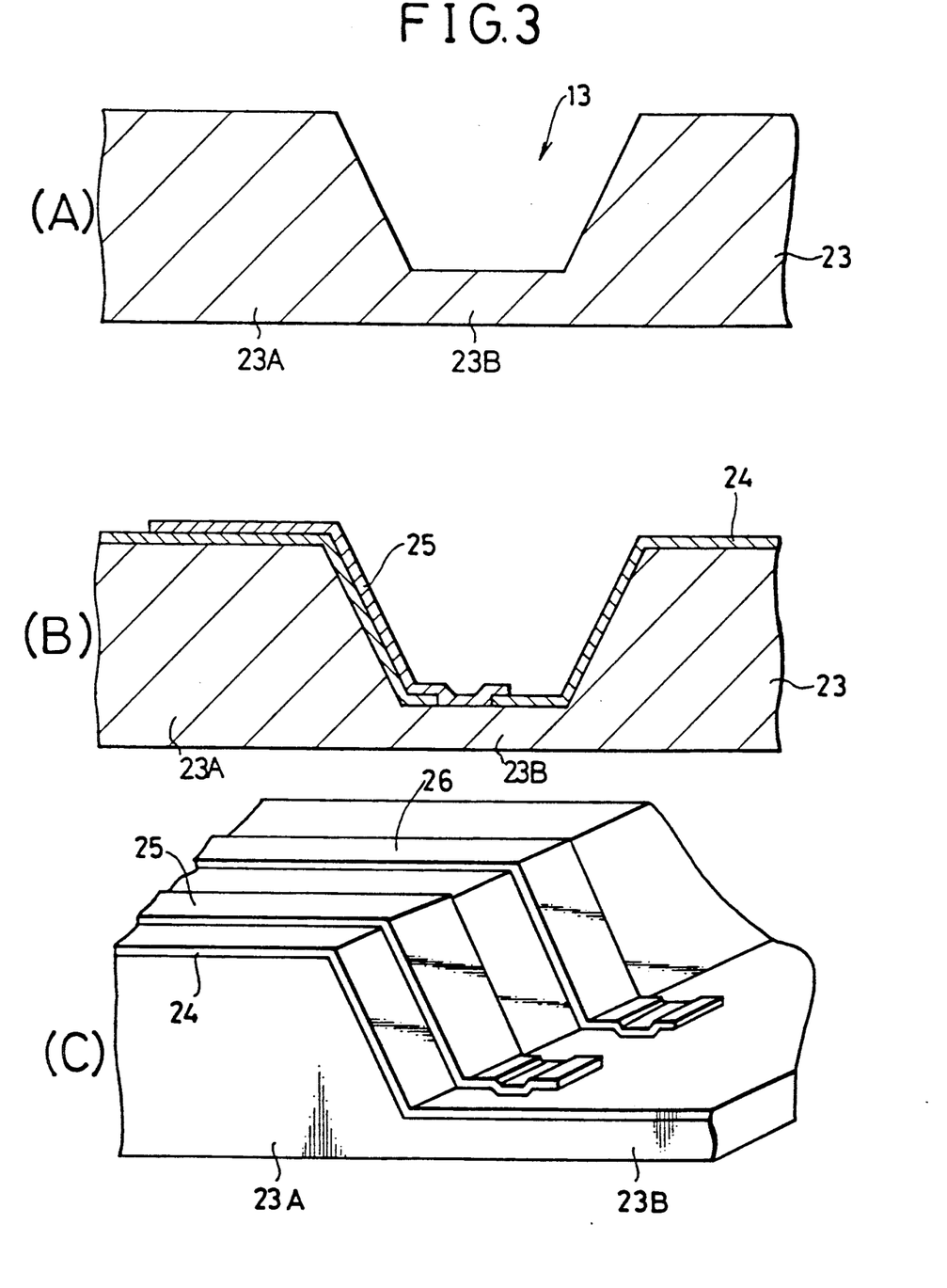
FIG. 3 shows a third embodiment of a semiconductor device having a plurality of terminals in a groove according to the present invention.

In FIG. 3, there is shown the third embodiment of a semiconductor device according to the present invention, which is an upside-down view as compared with FIGS. 1 and 2, having the same structure as that of the first or second embodiment shown in FIG. 1 or 2, except that a plurality of rear output terminals are formed in one groove of the rear surface of a substrate, as hereinafter described, and thus the other members may be omitted from FIG. 3 and the following description for the brevity.

In this embodiment, a semiconductor substrate 23 is formed with a groove 13 in the rear surface (upper surface in FIG. 3) to form a non-etched thick portion 23A and an etched thin portion 23B, as shown in FIG. 3A, and then is formed with an insulating oxide film 24 over the groove 13 and the rear surface in the same manner as the previous embodiments shown in FIGS. 1 and 2. Then, a plurality of output terminals (only two terminals are shown in FIG. 3) 25 and 26, which correspond to a combination of the contact portion 12A and the rear surface wiring portion 12B shown in FIGS. 1 and 2, are formed in the groove 13 in the same manner as the previous embodiments, as shown in FIGS. 3B and 3C.

In this case, the plurality of rear electrode terminals such as drain output terminals are formed at the predetermined interval, as shown in FIG. 3C. For instance, a drain of a MOS transistor is reverse-biased in a PN junction state, and therefore is separated by itself from the others. Further, in case of an active device which is not separated by itself, it is necessary to separate each electrode portion formed in an etched thin portion 23b by forming a separation area using a PN junction separation or an insulating groove separation, thereby separately picking up each electrode output. Further, another electrode terminal may be separately formed on the rear surface by supplementarily forming another groove within the same tip in the same manner as described above.

Figure 4:
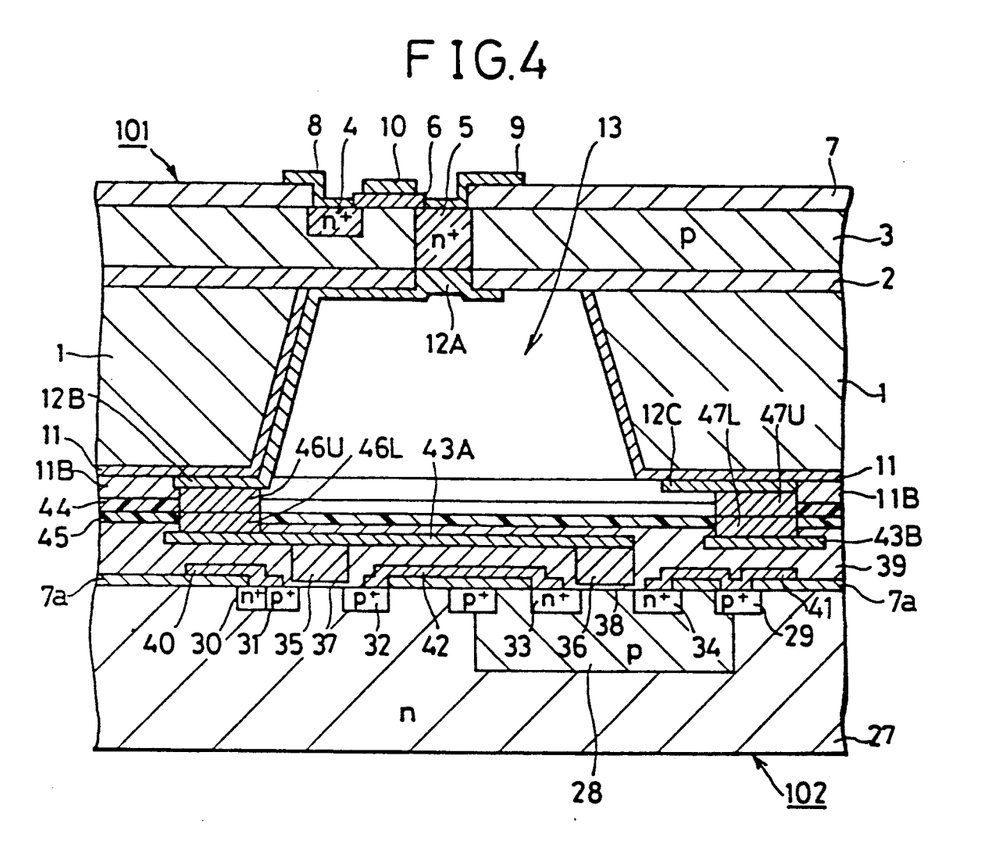
FIG. 4 is a cross sectional view of a fourth embodiment of a two-layer lamination three-dimensional semiconductor device according to the present invention, including the semiconductor device shown in FIG. 1.

There is shown in FIG. 4 the fourth embodiment of a two-layer lamination three-dimensional semiconductor device according to the present invension. In this embodiment, a first semiconductor device 101 having, for instance, the same structure as the first or second embodiment shown in FIG. 1 or 2, and a second semiconductor device 102 of a conventional IC having a CMOS structure are laminated one on another at their certain electrodes by a heat-pressure connection method.

In FIG. 4, the upper first device 101 has the same construction as the first embodiment shown in FIG. 1, and the detailed description thereof can be omitted. Then, the second semiconductor device 102 will be described as follows.

A field oxide film 7a is formed over the front or upper surface of an n-type semiconductor substrate 27, and in the upper surface area of the substrate 27, a p-type well region 28 is formed. A pair of p$^+$-type well contact regions 29 are formed in the contact areas between the substrate 27 and the well region 28, and an n$^+$-type base contact region 30, a p$^+$-type source region 31 contacted therewith, a p$^+$-type drain region 32, an n$^-$-type drain region 33 and an n$^-$-type source region 34 are formed in the surface portions of the substrate 27 and the well region 28 (the former three in the substrate 27 and the latter two in the well region 28). A $V_{DD}$ electrode 40, a $V_{SS}$ electrode 41 and a CMOS output electrode 42 are formed on the contact and source regions 30 and 31, the two drain regions 32 and 33, and the well contact and source regions 29 and 34, respectively.

An insulating film 39 is formed over the upper surface of the substrate 27, and two highly concentrated silicon gates 35 and 36 and two gate oxide films 37 and 38 thereunder are formed in the insulating film 39. A CMOS gate contact electrode 43A and another electrode 43B are formed in the insulating film 39. Two polyimide film layers 44 and 45 and upper and lower two-layer gold-titanium (Au/Ti) alloy layer electrodes 46U, 46L, 47U and 47L are formed, as hereinafter described.

As shown in FIG. 4, the coupling of the upper and lower semiconductor devices 101 and 102 is performed in almost the same way as that disclosed in the report "Promising New Fabrication Process Developed For Stacked LSI's" of International Electron Devices Meeting Technical Digest, 1984, pp816, by M. Yasumoto et al.

In this method, first, two two-layer gold-titanium (Au/Ti) alloy layers 46L and 47L are formed on the two aluminum electrodes 43A and 43B, and then a polyimide layer 45 is coated over the surface of the substrate up to the same height as that of the Au/Ti layer electrodes 46L and 47L. Then, the coated surface of the substrate is treated by a plasma oxygen ($O_2$) etching to expose the Au/Ti electrodes 46L and 47L and to make flat the surface of the polyimide layer 45 and the Au/Ti electrodes 46L and 47L in the same time.

On the other hand, at the rear surface of the first device 101, the aluminum electrode 12B integrally connected to the contact portion 12A and another aluminum electrode 12C are prepared, in advance, in the proper positions, and then two Au/Ti layer electrodes 46U and 47U are formed on the two aluminum electrodes 12B and 12C so as to coincide with the Au/Ti electrodes 46L and 47L of the second device 102 when the two devices 101 and 102 are positioned to align to the desired position. Meanwhile an insulating film 11B is applied on the insulating oxide film 11 of the rear surface of the substrate 1. Then, a polyimide layer 44 is coated over the rear surface of the substrate and the coated rear surface is also treated to a flat surface in the same manner as the flattened front surface of the second device 102, as described above. The two flattened surfaces of the two devices 101 and 102 are contacted with each other so as to contact the Au/Ti electrodes 46U and 47U of the first device 101 with the Au/Ti electrodes 46L and 47L of the second device 102 in the right position, and then the pairs of Au/Ti electrodes 46U, 46L and 47U, 47L are securely connected to each other by the heat-pressure melting method, thereby coupling the first and second semiconductor devices 101 and 102.

When the two devices 101 and 102 are connected with a sufficient strength by connecting only the electrode portions, dummy electrodes or the like may be further additionally formed on the contact surfaces of the two devices. Further, although one example for securely connecting the Au/Ti electrodes is described hereinbefore, however, the present invention is not restricted to this example, and, of course, other proper methods may be used.

In this embodiment, the polyimide layers 44 and 45 effectively function for damping the stresses and giving the electric insulation. Further, the etched groove 13 may be closed by filling with the polyimide material in a devised manufacturing process. In this case, as shown in FIG. 4, by the output signal from the drain contact electrodes 12A and 12B of the upper first device 101, the switching may be carried out by driving the gate 43A of the CMOS inverter in the lower second device 102. Further, in the embodiment, of course, the same results, effects and advantages as those of the previous embodiments of the present invention can be obtained.

Figure 5:
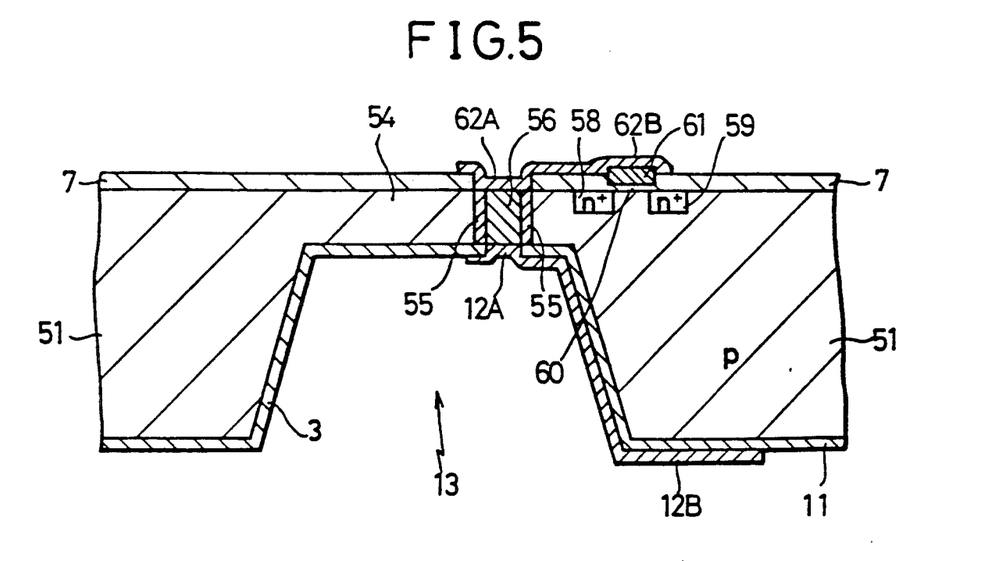
FIG. 5 is a cross sectional view of a fifth embodiment of a semiconductor device including a MOS transistor according to the present invention.

In FIG. 5, there is shown the fifth embodiment of a semiconductor device according to the present invention, having basically the same structure as the first embodiment shown in FIG. 1. In this embodiment, a field oxide film 7 is formed on the front main surface of an n-type semiconductor substrate 51 having a groove 13 in the rear surface, and an insulating oxide film 11 is formed over the groove 13 and the rear surface of the substrate 51.

In an etched thin portion 54 of the substrate 51, a low resitance ohmic region 56 is formed to penetrate the thin portion 54 from the front surface to the bottom (the upper surface of the groove 13 in FIG. 5) of the groove 13, and the ohmic region 56 is surrounded by insulating films 55 for electrically isolating or separating the ohmic region 56 from the substrate 51. The insulating films 55 are formed by a fine ditching step and an oxidizing step, and the ohmic region 56 can be formed by, for example, silicon polycrystalline or by doping an impurity in a high concentration into silicon monocrystalline. The ohmic region 56 may be also formed by using a metallic material having a high melting point such as molybdenum (Mo) or tantalum (Ta) in a contrived producing process. A combination of a rear surface contact member 12A and a rear surface electrode 12 is contacted to the bottom of the ohmic region 56 in the groove portion 13 in the same manner as described above.

In the front surface area of the substrate 51, a N-channel MOS transistor is provided. That is, an n$^+$-type source 58 and an n$^+$-type drain 59 are formed at a proper distance, and a silicon gate 61 and a gate oxide film 60 therebelow are formed in a conventional manner. The upper end surface of the ohmic region 56 and the silicon gate 61 are electrically coupled through respective electrodes 62A and 62B formed thereon.

In this embodiment, as described above, the front and rear surfaces of the substrate 51 are communicated via the low resistance ohmic region 56 while the ohmic region 56 is insulated from the surroundings. Accordingly, the silicon gate 61 in the front surface is connected to the rear surface electrodes 12A and 12B through the front surface electrodes 62A and 62B and the ohmic region 56. Hence, the N-channel MOS transistor in the front main surface can be driven by applying a voltage to the rear surface electrodes 12A and 12B. The same effects and advantages as those in the previous embodiments of the present invention can be obtained.

Although the silicon gate in the front surface is coupled to the rear surface electrode in the fifth embodiment, another part such as the drain or the source in the front surface can be, of course, connected to the rear surface electrode. Further, a plurality of the low resistance ohmic regions 56 which connects the N-channel MOS transistor formed in the front surface and the rear surface electrodes 12A and 12B, can be provided in one groove 13 in the same manner as the third embodiment shown, as shown in FIG. 3, and thus the detailed description thereof can be omitted.

Figure 6:
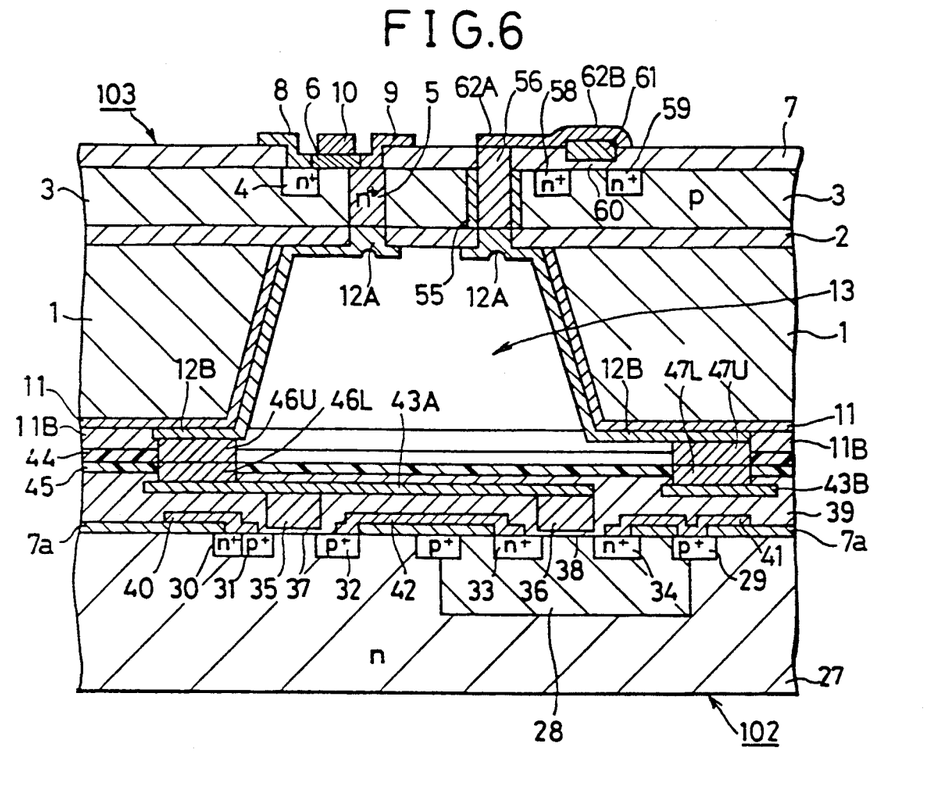
FIG. 6 is a cross sectional view of a sixth embodiment of a two-layer lamination three-dimensional semiconductor device according to the present invention, including the same and similar semiconductor devices as and to those shown in FIGS. 1 and 5.

In FIG. 6, there is shown the sixth embodiment of a two-layer lamination three-dimensional semiconductor device according to the present invention. In this embodiment, an upper first semiconductor device 103 and the lower second semiconductor device 102 shown in FIG. 4 are coupled in the same manner as the one shown in FIG. 4. The first semiconductor device 103 is prepared by further including substantially the same low resistance ohmic region 56 and MOS transistor of the fifth embodiment shown in FIG. 5 using the SOI substrate in the right half side portion of the first semiconductor device 101 shown in FIG. 4. Consequently, the detailed description of the first and second semiconductor devices 103 and 102 can be omitted for the brevity of the description.

In this case, of course, the same effects, advantages and results as those of the first, fourth and fifth embodiments of the present invention can be obtained, and the same effects, advantages and results as those of the previous embodiment of the present invention can be obtained as well.

Figure 7:
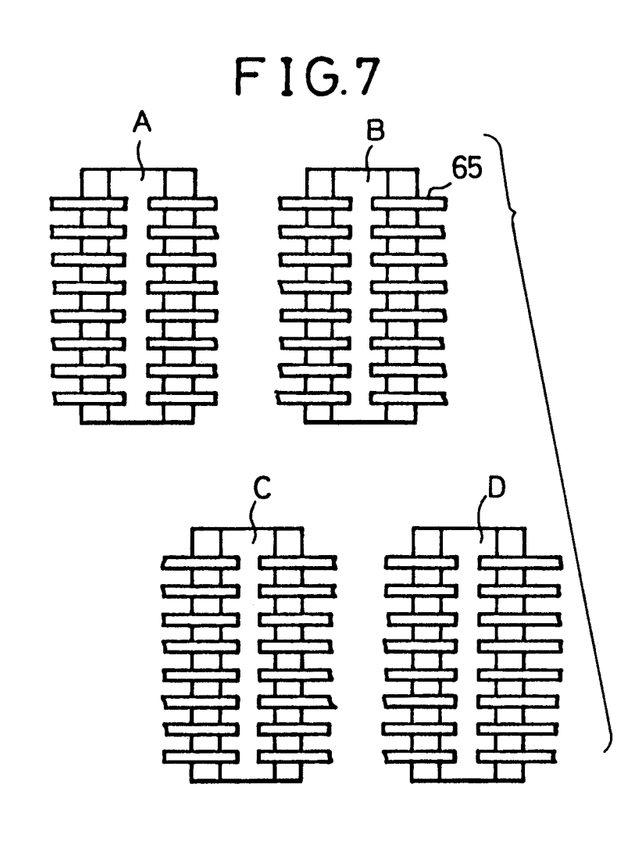
FIG. 7 is a bottom view of a seventh embodiment of a semiconductor device according to the present invention, showing 2×8 terminals for 2×8 bits of active devices, formed in each of four grooves on the rear surface of a semiconductor substrate.

FIG. 7 is a bottom view of the seventh embodiment of a semiconductor device according to the present invention. FIG. 7 shows four grooves A, B, C and D formed on the rear surface of the semiconductor device such as the one of the present embodiments shown in FIGS. 1, 2 and 5, and $2 \times 8 = 16$ rear contact terminals 65 formed in each of the grooves A, B, C and D for $2 \times 8 = 16$ bits of the wiring. In this embodiment, in fact, a plurality of semiconductor devices are stacked one on another to constitute a multi-layer lamination three-dimensional semiconductor device, and 16 bits of signals can be processed in parallel between the front and rear surfaces of each device and from the uppermost device to the lowermost device and vice versa.

In this case, for example, all contact terminals 65 of one groove A may be connected to lower resistance ohmic regions therein, and all contact terminals 65 of another groove B may be contacted with one electrodes such as drain terminals of active devices such as MOS transistors. When the signals are transmitted from the lower device to the upper device and vice versa in the same time, for instance, the terminals of the grooves C and D may be separately used for the signal transmissions in the upper and lower directions, respectively.

Figure 8:
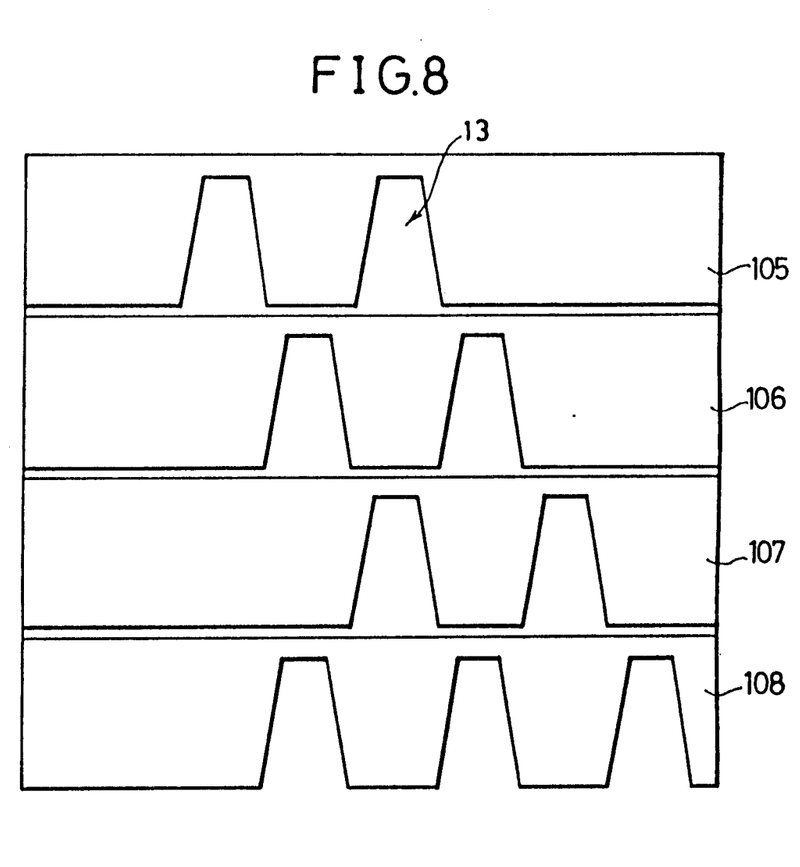
FIG. 8 is a schematic side view of the eighth embodiment according to the present invention, including four-layer lamination three-dimensional semiconductor device composed of four semiconductor devices of the present invention.

In FIG. 8, there is shown the eighth embodiment of four semiconductor devices 105, 106, 107 and 108 which constitute a four-layer lamination three-dimensional semiconductor device according to the present invention. In this embodiment, the four devices are so stacked that the grooves 13 of the two adjacent devices 105 and 106, 106 and 107 or 107 and 108 may not be aligned along vertical straight lines.

When the four devices are stacked one on another, as shown in FIG. 8 and each device includes four grooves, as shown in FIG. 7, 32 bits of signals of the two grooves and 32 bits of signals of the other two grooves may be processed in parallel in the upper and lower directions in the same time, thereby effectively utilizing the three-dimensional lamination semiconductor device. Further, according to the present invention, a plurality of semiconductor devices of the present invention are stacked one on another, in which, for instance, the devices are designed to have respective particular functions, such as one device including sensor, some other devices including operational ICs, still some other devices including memories, another device including a comparator IC and so forth, and they may be uses as a self-library. Each device may be designed independently for a particular purpose.

According to the present invention, a silicon-on-glass substrate and a silicon-on-sapphire substrate may be also conveniently used to produce a semiconductor device of the present invention by utilizing a silicon layer. The glass substrate and the sapphire substrate can be formed with a groove or a hole to a silicon layer in the rear surface by an etching or a reactive ion etching (RIE). As to the inclination of the groove 13, e.g., shown in FIG. 8, it may be determined by a crystalline surface such as a (111) surface, but the inclined angle may be optionally designed by using the RIE process together with a mask or a laser photo-chemical etching process.

The present invention can be applied to a tetrode type insulating gate device. Further, the present invention can be applicable to a silicon-on-silicon-on-silicon substrate or a monolithic multi-layer (for example, n-type three-layer) three-dimensional device prepared by a laser annealing.

Figure 9:
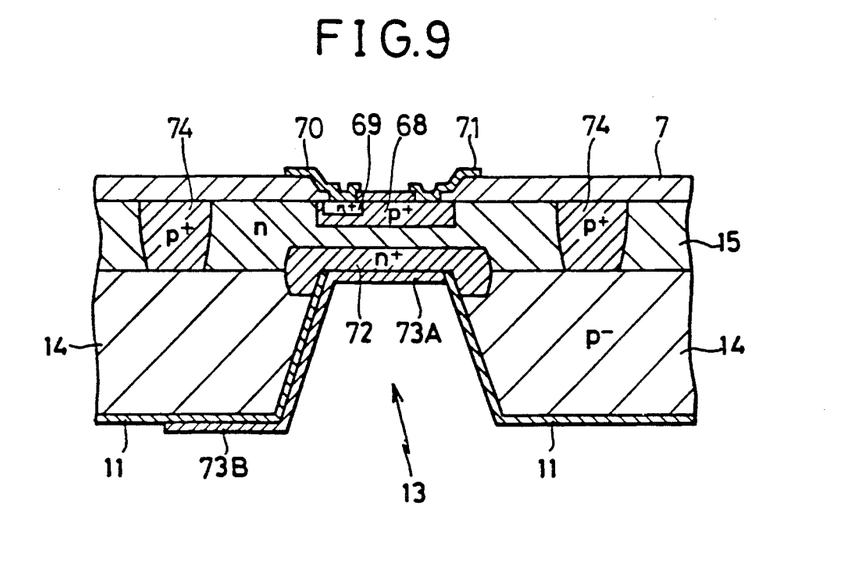
FIG. 9 is a cross sectional view of ninth embodiment of a semiconductor device including a bipolar transistor according to the present invention.

In FIG. 9, there is shown the ninth embodiment of a semiconductor device according to the present invention, having basically the same construction as that of the second embodiment, except a bipolar transistor instead of a MOS transistor.

In this embodiment, in the front main surface, a $p^+$-type base region 68 is formed in the surface portion of the n-type epitaxial layer 15 above the groove 13 of the $p^-$-type semiconductor substrate 14, and an $n^+$-type emitter region 69 if formed in the left side surface portion of the base region 68. An emitter electrode 70 is contacted to the surface of the emitter region 69, and a base electrode 71 is attached to the right side surface of the base region 68. An $n^+$-type buried collector layer 72 is formed in the contact portion between the substrate 14 and the epitaxial layer 15, and the bottom of the buried collector layer 72 exposes to the bottom (the upper end in FIG. 9) of the groove 13 in the rear surface of the substrate 14. A collector electrode 73A is contacted to the bottom of the buried collector layer 72 at the bottom of the groove 13, and a rear surface contact terminal 73B is integrally connected to the collector electrode 73A in the similar manner to the contact portion 12A and the rear surface wiring 12B of the second embodiment shown in FIG. 2. A pair of p⁻-type separation regions 74 for separating the collector are formed in the epixial layer 15. In this embodiment, the same effects and advantages as those of the previous embodiments of the present invention can be obtained.

It is readily understood that the present invention can be applicable to an integrated circuit including a bipolar transistor or a BiCMOS. Further, the present invention can be applied to the Josephson junction superconductive device or the J, J, superconductor computer system. The semiconductor device of the present invention can be formed in an Nb wiring-on-silicon oxide film-on Nb ground plane or the like, as well as a new high temperature superconductive film such as a Y-Ba-Cu-O system now being developed.

What is claimed is:

1. A semiconductor device, comprising:
   a semiconductor layer;
   at least one groove formed in a rear surface portion of the semiconductor layer;
   at least two active devices independently formed in a front surface area of the semiconductor layer adjacent said groove, each of said active devices having at least two electrodes;
   at least two low resistance terminal members attached to the rear surface of the semiconductor layer via an insulating film formed therebetween for separating the same from each other; and
   at least two means for communicating the front and the rear surfaces in the vicinity of a thin portion of a substrate caused by the groove formation;
   each of said communicating means formed in the semiconductor layer and exposed to the groove;
   each of said communicating means including at least one of the electrodes of each active device in the front surface and connecting with one of the low resistance terminal members in the rear surface inside the groove, said this portion of the substrate having at the rear surface at least two terminal electrode contact regions of the active devices, which are also the terminal electrode contact regions of each of said communicating means;
   Said electrode contact regions of each of said active devices in the rear surface of the thin portion isolated from each other in an Integrated Circuit structure, and forming one of the terminal electrode contact regions of said active devices.

2. The device of claim 1, wherein at least two of said terminal electrode contact regions of the active devices in the rear surface of said thin portion are those of terminal electrode contact regions of self isolating drains of Lateral MOS transistors which have reverse biased pn junction isolation with respect to the semiconductor substrate and to the surrounding surface.

3. The device of claim 1, wherein at least two of said terminal electrode contact regions of the active devices in the rear surface of said thin portion are those of contact regions which are buried regions of the active devices.

4. The device of claim 3, wherein at least two of said terminal electrode contact regions of the active devices in the rear surface of said thin portion are those of contact regions which are buried drain regions of DSA vertical MOS transistors, isolated from each other in the Integrated Circuit structure.

5. The device of claim 3, wherein at least two of said terminal electrode contact regions of the active devices in the rear surface of the thin portion are those of contact regions which are buried collector regions of vertical bipolar transistors isolated from each other in the Integrated Circuit structure.

6. The device of claim 1, wherein at least two of said electrodes contact regions of each of said active devices in the rear surface of the thin portion include the respective one of the terminal electrode contact regions of two different kinds of active devices isolated from each other in the Integrated Circuit structure.

7. The device of claim 1, wherein at least one of said electrode contact regions of a third communicating means in the rear surface of the thin portion is introduced, said third communicating means comprising a low resistance ohmic region formed by passing through a thin portion of the semiconductor layer and respective insulating film for isolating the ohmic region from the semiconductor layer and isolating from said two electrode contact regions of each of said active devices in the rear surface in the Integrated Circuit structure.

8. A three-dimensional semiconductor device, comprising a first semiconductor device and a second semiconductor device stacked one on another, the first semiconductor device including:
   a first semiconductor layer;
   at least one groove formed in a rear surface portion of the semiconductor layer;
   at least first and second active devices independently formed in a front surface area of the semicondutor layer adjacent to said groove, each of said active devices having at least two electrodes;
   at least first and second low resistance terminal members attached to the rear surface of the first semiconductor layer via an insulating film formed therebetween for separating the same from each other; and
   at least two means for communicating the front and the rear surfaces in the vicinity of a thin portion of a semiconductor substrate caused by the groove formation;
   each of said communicating means formed in the semiconductor layer and exposed to the groove;
   each of said communicating means including at least one of the electrodes of each of said active devices in the front surface and connecting with one of the low resistance terminal members in the rear surface inside the groove;
   said thin portion of the semiconductor substrate having at the rear surface, at least two terminal electrode contact regions of each of the active devices, which are also the terminal electrode contact regions of each of said communicating means;
   said terminal electrode contact regions of each of said active devices in the rear surface of the thin portion isolated from each other in an Integrated Circuit structure, and forming one of the terminal electrode contact regions of said active devices;
   the second semiconductor device including:
   a second semiconductor layer; and
   a third active device having at least two electrodes, formed in the second semiconductor layer, one of the electrodes of the third active device connecting with at least one of the communicating means formed in the first semiconductor device.

9. The device of claim 8, wherein one of the electrodes of at least one of the first and second active devices is securely connected to the one of the electrodes of the third active device through two-layer electrodes attached to the respective electrodes.

10. The device of claim 8, wherein at least two contact surfaces of the electrodes of at least one of the first and second active devices and the third active device are formed with a polyamide layer having flat surfaces.

11. The device of claim 8, wherein at least two of said terminal electrode contact regions of the active devices in the rear surface of said thin portion are those of terminal electrode contact regions of self isolating drains of Lateral MOS transistors which have reverse biased pn junction isolation with respect to the semiconductor substrate and to the surrounding surface.

12. The device of claim 8, wherein at least two of said terminal electrode contact regions of the active devices in the rear surface of said thin portion are those of terminal electrode contact regions which are buried regions of the active devices.

13. The device of claim 12, wherein at least two of said terminal electrode contact regions of the active devices in the rear surface of said thin portion are those of terminal electrode contact regions which are buried drain regions of DSA vertical MOs transistors, isolated from each other in the Intergrated Circuit structure.

14. The device of claim 12, wherein at least two said terminal electrode contact regions of the active devices in the rear surface of said thin portion are those of terminal electrode contact regions which are buried collector regions of vertical bipolar transistors isolated from each other in the Integrated Circuit structure.

15. The device of claim 8, wherein at least two of said electrode contact regions of each of said active devices in the rear surface of said thin portion includes the respective one of the terminal electrode contact regions of two different kind of active devices isolated from each other in the Integrated Circuit structure.

16. The device of claim 8, wherein at least one of said terminal electrode contact regions of a fifth communicating means in the rear surface of thin portion is introduced, said fifth communicating means comprising a low-resistance ohmic region formed by passing through a thin portion of the semiconductor layer and respective insulating film regions for isolating the ohmic region from the semiconductor layer and isolated from said two terminal electrode contact regions of each of said active devices in the rear surface in the Integrated Circuit structure.

17. A semiconductor device, comprising a semiconductor layer formed with at least one groove in a rear portion thereof;
at least first and second active devices independently formed in a front surface area of the semiconductor layer adjacent to said groove, each of said active devices having at least two electrodes;
at least first and second low resistance terminal members attached to the rear surface of the first semiconductor layer via insulating film formed therebetween for separating the same from each other;
at least first and second means for commmunciating the front and rear surfaces of the first semiconductor layer, each of the first and second communicating means having a low resistance ohmic region formed by passing through a thin portion of the substrate including the first semiconductor layer, an electrode of the low resistance ohmic region being connected with one of the two low resistance terminal members attached to the rear surface of the first semiconductor layer inside the groove, each of the first and second communicating means being exposed to the groove;
said low resistance ohmic regions isolated by the insulating film from the semiconductor layer in vicinity of the thin portion of the substrate caused by the groove formation.

18. The device of claim 17, wherein at least one electrode contact region of a third communicating means in the rear surface of thin portion is introduced, said third communicating means comprising at least one electrode contact region of a sixth active device in the rear surface of the thin portion and also other electrode contact regions of the sixth active device in the front surface;
said electrode contact region of the third communicating means by said active device in the rear surface is isolated from the first and second electrode contact regions of the communicating means at the rear surface in an Integrated Circuit structure.

19. The semiconductor device of claim 17, wherein the low resistance ohmic region is exposed to the groove.

20. The semiconductor device of claim 17, wherein in the low resistance ohmic region is formed of polysilicon.

21. The semiconductor device of claim 17, wherein the low resistance ohmic region is formed of a monocrystal silicon with a high impurity concentration.

22. The semiconductor device of claim 17, wherein the low resistance ohmic region is a metallic material having a high melting point.

23. A three-dimensional semiconductor device, comprising a first semiconductor device and a second semiconductor device stacked one on another, the first semiconductor device including:
a semiconductor layer formed with at least one groove in a rear surface portion thereof;
at least first and second active devices independently formed in a front surface area of the semiconductor layer adjacent said groove, each of said active devices having at least two electrodes;
at least first and second low resistance terminal members attached to the rear surface of the first semiconductor layer via insulating film formed therebetween for separating the same from each other;
at least first and second means for communicating the front and rear surfaces of the first semiconductor layer, each of the first and second communicating means having a low resistance ohmic region formed by passing through a thin portion of the substrate including the first semiconductor layer, an electrode of the low resistance ohmic region being connected with one of the two resistance ohmic regions being connected with one of the two low resistance terminal members attached to the rear surface of the first semicoductor layer inside the groove, each of the first and second communicating means being exposed to the groove;
said low resistance ohmic regions isolated by the insulating film from the semiconductor layer in vicinity of the thin portion of the substrate caused by the groove formation;
and the second semiconductor device including:
a second semiconductor layer; and
a third active device having at least two electrodes, formed in the second semiconductor layer, one of the electrodes of the third active device connecting with at least one of the first and second communicating means formed in the first semiconductor device.

24. The semiconductor device of claim 23, wherein the low resistance ohmic region is exposed to the groove.

25. The semiconductor device of claim 23, wherein the low resistance ohmic region is formed by pollysilicon.

26. The semiconductor device of claim 23, wherein the low resistance ohmic region is formed of a monocrystal silicon with a high impurity concentration.

27. The semiconductor device of claim 23, wherein the low resistance ohmic region is a metallic material having a high melting point.

28. A semiconductor device comprising:
a substrate composed of an isolating substrate and a semiconductor layer formed thereon;
at least one groove formed in a rear surface portion of the substrate;
at least two active devices independently formed in a front surface area of the semiconductor layer of the substrate adjacent to said groove, each of said active devices having at least two electrodes;
at least two low resistance terminal members attached to the rear surface of the substrate in an area including the groove via an insulating film formed therebetween for separating the same from each other; and
at least two means for communicating the fron and the rear surface in the vicinity of the thin portion of the substrate caused by the groove formation;
each of said communicating means formed in the semiconductor layer and exposed to the groove;
said thin portion of the substrate being the semiconductor layer or the semiconductor layer on the remaining thin insulating layer of the insulating substrate material;
each of said communicating means including at least one of the electrodes of each of said active devices in the front surface and connecting with one of the low resistance terminal members in the rear surface inside the groove;
said thin portion of the semiconductor substrate having at the rear surface, at least two terminals electrode contact regions of the active devices, which are also the terminal electrode contact regions of each of said communicating means;
said electrodes contact regions of each of said active devices in the rear surface of the thin portion isolated from each other in an Integrated Circuit structure, and forming one of the terminal electrode contact regions of said active devices.

29. The device of claim 28, wherein the insulating substrate is a glass substrate.

30. The device of claim 28, wherein the insulating substrate is a sapphire substrate.

31. The device of claim 28, wherein at least two of said terminal electrode contact regions of the active devices in the rear surface of said thin porion are those of terminal electrode contact regions of self isolating drains of Lateral MOS transistors which have reverse biased pn junction isolation with respect to the semiconductor substrate and to the surrounding semiconductor surface.

32. The device of claim 28, wherein at least two of said terminal electrode contact regions of the active devices in the rear surface of said thin portion are those of contact regions which are buried regions of the active devices.

33. The device of claim 32, wherein at least two of said terminal electrode contact regions of the active devices in the rear surface of said thin portion are those of contact region which are buried drain region of DSA vertical MOS transistors isolated from each other in the Integrated Circuit structure.

34. The device of claim 32, wherein at least two said terminal electrode contact regions of the active devices in the rear surface of thin portion are those of contact regions which are buried collector regions of vertical bipolar transistors isolated from each other in the Integrated Circuit structure.

35. The device of claim 28, wherein at least two of said electrode contact regions of each of said active device in the rear surface of thin portion includes the respective one of the terminal electrode contact regions of two different kind of active devices isolated from each other in the Integrated Circuit structure.

36. The device of claim 28, wherein at least one of said electrode contact regions of a third communicating means in the rear surface of the thin portion is introduced, said third communicating means comprising a low resistance ohmic region formed by passing through a thin portion of the semiconductor layer and respective insulating film regions for isolating the ohmic region from the semiconductor layer and also isolated from said two terminal electrode contact regions of each of said active devices in the rear surface in the Integrated Circuit structure.

37. A three-dimensional semiconductor device, comprising a first semi-conductor device and a second semiconductor device stacked one on another, the first semiconductor device including:
a substrate composed of an insulating substrate and a semiconductor layer formed thereon;
at least one groove formed in a rear surface portion of the substrate;
at least two active devices independently formed in a front surface area of the semiconductor layer of the substrate adjacent to said groove, each of said active devices having at least two electrodes;
at least two low resistance terminal members attached to the rear surface of the substrate in an area including the groove via an insulating film formed therebetween for separating the same from each other; and
at least two means of communicating the front and the rear surface in the vicinity of a thin portion of the substrate caused by the groove formation;
each of said communicating means formed in the semiconductor layer and exposed to the groove;
said thin portion of the substrate being the semiconductor layer of the semiconductor layer on the remaining thin insulating layer of the insulating substrate material;
each of said communicating means including at least one of the electrodes of each of said active devices in the front surface and connecting with one of the low resistance terminal members in the rear surface inside the groove;
said thin portion of the semiconductor substrate having at the rear surface at least two terminal electrode contact regions of the active devices, which are also the terminal electrode contact regions of each of said communicating means;

said electrode contact regions of each of said active devices in the rear surface of the thin portion isolated from each other in an Integrated Circuit structure, and forming one of the terminal electrode contact regions of said active devices;
the second semiconductor layer; and
a third active device having at least two electrodes, formed in the second semiconductor layer, one of the electrodes of the third active device connecting with at least one of the first and second communicating means formed in the first semiconductor device.

38. The device of claim 37 wherein the one of the electrodes of at least one of the first and second active devices is securely connected to the one of the electrodes of the third active device through two-layer electrodes attached to the respective electrodes.

39. The device of claim 37 wherein at least two contact surfaces of the electrodes of at least one of the first and second active devices and the third active device are formed with polyamide layers having flat surfaces.

40. The device of claim 37 wherein at least two of said terminal electrode contact regions of the active devices in the rear surface of said thin portion are those of said terminal electrode contact regions of self isolating drains of Lateral MOS transistors which have reverse biased pn junction isolation with respect to the semiconductor substrate and to the surrounding surface.

41. The device of claim 37 wherein at least two of said terminal electrode contact regions of the active devices in the rear surface of said thin portion are those of contact regions which are buried regions of the active devices.

42. The device of claim 37, wherein at least two of said terminal electrode contact regions of the active devices in the rear surface of said thin portion are those of contact regions which are buried drain region of DSA vertical MOS transistors isolated from each other in the Integrated Circuit structure.

43. The device of claim 37, wherein at least two of said terminal electrode contact regions of the active devices in the rear surface of the thin portion are those of contact regions which are buried collector regions of vertical bipolar transistors isolated from each other in the Integrated Circuit structure.

44. The device of claim 37, wherein at least two of said electrode contact regions of each of said active device in the rear surface of the thin portion comprising the respective one of the terminal electrode contact regions of two different kinds of active devices isolated from each other in the Integrated Circuit structure.

45. The device of claim 37, wherein at least one of said electrode contact regions of a fifth communicating means in the rear surface of the thin portion is introduced, said fifth communicating means comprising a low resistance ohmic region formed by passing through a thin portion of the semiconductor layer and respective insulating film regions for isolating the ohmic region from the semiconductor layer and also isolated from said two electrode regions of each of said active devices in the rear surface in the Integrated Circuit structure.

46. A semiconductor device, comprising a substrate composed of an insulating substrate and a semiconductor layer formed thereon;
at least one groove formed in a rear portion thereof;
at least first and second active devices independently formed in a front surface area of the semiconductor layer of the substrate adjacent said groove, each of said active devices having at least two electrodes;
at least first and second low resistance terminal members attached to the rear surface of the substrate in an area including the groove via insulating film formed therebetween for separating the same from each other;
at least first and second means for communicating the front and rear surfaces of the first semiconductor layer, each of the first and second communicating means having a low resistance ohmic region formed by passing through a thin portion of the substrate including the first semiconductor layer, an electrode of the low resistance ohmic region being connected with one of the two low resistance terminal members attached to the rear surface of the first semiconductor layer inside the groove, each of the first and second communicating means being exposed to the groove; and
said low resistance ohmic regions isolated by the insulating film region from the semiconductor layer in vicinity of the thin portion of the substrate caused by the groove formation.

47. The semiconductor device of claim 46, wherein the low resistance ohmic region is exposed to the groove.

48. The semiconductor device of claim 46, wherein the low resistance ohmic region is formed of polysilicon.

49. The semiconductor device of claim 46, wherein the low resistance ohmic region is formed of a monocrystal silicon with a high impurity concentration.

50. The semiconductor device of claim 46, wherein the low resistance ohmic region is a metallic material having a high melting point.

51. A three-dimensional semiconductor device, comprising a first semiconductor device and a second semiconductor device stacked one on another, the first semiconductor device including:
a substrate composed of an insulating substrate and a semiconductor level formed thereon;
at least one groove formed in a rear portion thereof;
at least first and second active devices independently formed in a front surface area of the semiconductor layer of the substrate adjacent said groove, each of said active devices having at least two electrodes;
at least first and second low resistance terminal members attached to the rear surface of the substrate in an area including the groove via insulating film formed therebetween for separating the same from each other;
at least first and second means for communicating the front and rear surfaces of the first semiconductor layer, each of the first and second communicating means having a low resistance ohmic region formed by passing through a thin portion of the substrate including the first semiconductor layer, an electrode of the low resistance ohmic region being connected with one of the two low resistance terminal members attached to the rear surface of the first semiconductor layer inside the groove, each of the first and second communicating means being exposed to the groove;
said low resistance ohmic regions isolated by the insulating film region from the semiconductor layer in vicinity of the thin portion of the substrate caused by the groove formation;
and the second semiconductor device including:

a seocnd semiconductor layer; and a third active device having at least two electrodes, formed in the second semiconductor layer, one of the electrodes of the third active device connecting with at least one of the first and second communicating means formed in the first semiconductor device.

52. The semiconductor device of claim 51, wherein the low resistance ohmic region is exposed to the groove.

53. The semiconductor device of claim 51, wherein the low resistance ohmic region is formed of pollysilicon.

54. The semiconductor device of claim 51, wherein the low resistance ohmic region is formed of a monocrystal silicon with a high impurity concentration.

55. The semiconductor device of claims 51, wherein the low resistance ohmic region is a metallic material having a high melting point.

* * * * *